US011239137B1

(12) United States Patent
Zhou

(10) Patent No.: US 11,239,137 B1
(45) Date of Patent: Feb. 1, 2022

(54) POWER DEVICE EMBEDDED DRIVER BOARD ASSEMBLIES WITH COOLING STRUCTURES AND METHODS THEREOF

(71) Applicant: Toyota Motor Engineering & Manufacturing North America, Inc., Plano, TX (US)

(72) Inventor: Feng Zhou, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/943,152

(22) Filed: Jul. 30, 2020

(51) Int. Cl.
*H01L 21/48* (2006.01)
*H01L 23/473* (2006.01)
*H01L 23/40* (2006.01)
*H01L 23/31* (2006.01)
*H01L 25/00* (2006.01)
*H01L 25/07* (2006.01)
*H01L 25/18* (2006.01)

(52) U.S. Cl.
CPC ...... *H01L 23/4735* (2013.01); *H01L 21/4803* (2013.01); *H01L 21/4882* (2013.01); *H01L 23/3121* (2013.01); *H01L 23/4006* (2013.01); *H01L 25/50* (2013.01); *H01L 25/072* (2013.01); *H01L 25/18* (2013.01); *H01L 2023/4087* (2013.01)

(58) Field of Classification Search
CPC ............. H01L 23/4735; H01L 23/3121; H01L 23/4006; H01L 21/4803; H01L 21/4882; H01L 25/50; H01L 25/072; H01L 25/18; H01L 2023/4087
See application file for complete search history.

(56) References Cited

U.S. PATENT DOCUMENTS

| 8,169,779 B2 | 5/2012 | Le et al. |
| 8,199,505 B2 | 6/2012 | Dede |
| 8,464,781 B2 | 6/2013 | Kenny et al. |

(Continued)

OTHER PUBLICATIONS

Tiwei Wei, Herman Oprins, Vladimir Cherman and Martine Baelmans; "3D Printed Liquid Jet Impingement Cooler: Demonstration, Opportunities and Challenges"; Institute of Electrical and Electronics Engineers; May 2018; 7 Pages; https://www.researchgate.net/publication/325441814_3D_Printed_Liquid_Jet_Impingement_Cooler_Demonstration_Opportunities_and_Challenges.

(Continued)

*Primary Examiner* — Timor Karimy
(74) *Attorney, Agent, or Firm* — Dinsmore & Shohl LLP

(57) ABSTRACT

A driver board assembly includes first and second substrates, one or more power device assemblies and a cooling manifold. At least one jet impingement assembly is formed on a first surface of the first substrate and includes an impingement receiving portion that is at least partially circumferentially surrounded by a plurality of fluid microchannels that extend radially from the impingement receiving portion along the first surface. The second substrate is bonded onto the first substrate. The second substrate surface has a recess. The plurality of receiving contours are etched within the first surface of the first substrate. The one or more power device assemblies are bonded into the recess of the second substrate. A first cooling surface of the cooling manifold is bonded to the first surface such that the first cooling surface bonds within the plurality of receiving contours within the first surface of the first substrate.

20 Claims, 7 Drawing Sheets

(56) References Cited

U.S. PATENT DOCUMENTS

| | | |
|---|---|---|
| 9,445,526 B2 | 9/2016 | Zhou et al. |
| 9,484,283 B2 | 11/2016 | Joshi et al. |
| 9,980,415 B2 | 5/2018 | Zhou et al. |
| 10,334,755 B2 | 6/2019 | Oprins et al. |

OTHER PUBLICATIONS

Tiwei Wei, Herman Oprins, Vladimir Cherman and Shoufeng Yang; "Experimental Characterization of a Chip Level 3D Printed Microjet Liquid Impingement Cooler for High Performance Systems"; Institute of Electrical and Electronics Engineers; Mar. 2019; 4 Pages; https://www.researchgate.net/publication/331745867_Experimental_Characterization_of_a_Chip_Level_3D_Printed_Microjet_Liquid_Impingement_Cooler_for_High_Performance_Systems.

POWER DEVICE EMBEDDED DRIVER BOARD ASSEMBLIES WITH COOLING STRUCTURES AND METHODS THEREOF

TECHNICAL FIELD

The present specification generally relates to a driver board assembly and, more specifically, a driver board assembly with a bonded cooling manifold structure.

BACKGROUND

Power electronics devices are often utilized in high-power electrical applications, such as inverter systems for hybrid electric vehicles and electric vehicles. Such power electronics devices include power semiconductor devices such as power insulated-gate bipolar transistors (IGBTs) and power transistors thermally bonded to a metal substrate. With advances in battery technology and increases in electronics device packaging density, operating temperatures of power electronics devices have increased and exceed 200° Celsius especially when power devices are embedded within driver board assemblies. Heat sinking devices may be coupled to power electronics devices to remove heat and lower the maximum operating temperature of the power semiconductor devices. Cooling fluid may be used to receive heat generated by the power semiconductor device by convective thermal transfer, and remove such heat from the power semiconductor device. For example, a jet of cooling fluid may be directed such that it impinges a surface of the power semiconductor device. Another way to remove heat from a power semiconductor device is to couple the power semiconductor device to a finned heat sink made of a thermally conductive material, such as aluminum.

However, as power electronics devices embedded in printed circuit boards are designed to operate at increased power levels thereby generating more heat due to the demands of newly developed electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials, and copper vias to connect different copper layers within printed circuit boards). These additional layers add substantial thermal resistance to the overall assembly and make thermal management of the electronics system challenging.

Accordingly, a need exists for alternative power electronics assemblies and power electronics devices having internal cooling structures, and methods for fabricating said alternative power electronic assemblies.

SUMMARY

Embodiments of the present disclosure are directed to a driver board assembly that includes a first substrate, a second substrate, a plurality of receiving contours, one or more power device assemblies and a cooling manifold. The first substrate has a first surface and an opposite second surface. At least one jet impingement assembly formed on the first surface of the first substrate. The at least one jet impingement assembly extends in a system vertical direction from the first surface. The at least one jet impingement assembly includes an impingement receiving portion that is at least partially circumferentially surrounded by a plurality of fluid microchannels that extend radially from the impingement receiving portion along the first surface. The second substrate has a first substrate surface and a second substrate surface opposite the first substrate surface. The first substrate surface is bonded onto a second surface of the first substrate. The second substrate surface has a recess. The plurality of receiving contours are etched within the first surface of the first substrate. The one or more power device assemblies are bonded into the recess of the second substrate surface of the second substrate. The cooling manifold has a first cooling surface and an opposite second cooling surface and a cavity that extends within the first cooling surface. The first cooling surface is bonded to the first surface such that the first cooling surface bonds within the plurality of receiving contours within the first surface of the first substrate. The cavity of the first cooling surface receives at least a portion of the first substrate and the at least one jet impingement assembly.

In another aspect, a method of manufacturing a driver board assembly. The method includes forming a first substrate with at least one jet impingement assembly on a first surface of the first substrate, the at least one jet impingement assembly extends in a system vertical direction from the first surface, the at least one jet impingement assembly includes an impingement receiving portion that is at least partially circumferentially surrounded by a plurality of fluid microchannels that extend radially from the impingement receiving portion along the first surface, bonding a second substrate onto a second surface of the first substrate, the second surface is opposite the first surface of the first substrate, and etching the first surface of the first substrate to form a plurality of receiving contours within the first surface of the first substrate. The method continues by bonding one or more power device assemblies onto the second substrate, forming a cooling manifold having a first cooling surface and an opposite second cooling surface, a cavity extends within the first cooling surface, and bonding the first cooling surface of the cooling manifold to the first surface such that the first cooling surface bonds within the plurality of receiving contours within the first surface of the first substrate, the cavity of the first cooling surface receives at least a portion of the first substrate and the at least one jet impingement assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
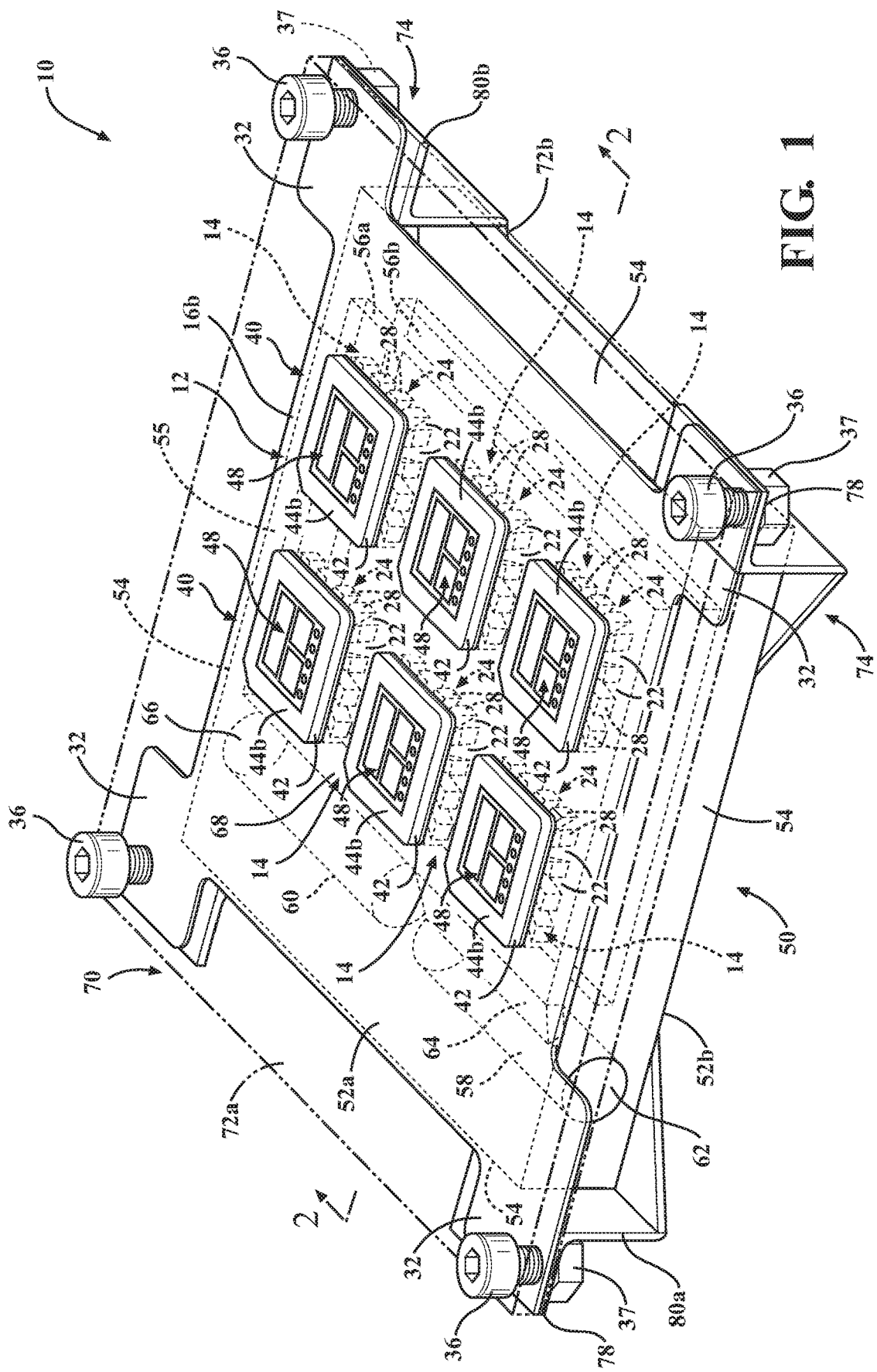
FIG. 1 schematically depicts a perspective view of a driver board assembly having jet impingement cooling assemblies and a cooling manifold according to one or more embodiments shown and described herein.

Embodiments of the present disclosure are directed to driver board assemblies and methods for assembling driver board assemblies with cooling structures. Driver board assemblies include embedded power devices into a gate driver printed circuit board (PCB) for automotive power electronics and other power systems. The embedded power devices shown and described herein utilize copper layers and/or copper vias to form inverter, convertor, or similar topology.

In the embodiments described herein, the first substrate is formed with a plurality of jet impingement fin assemblies on a first surface and one or more power electronic devices is bonded to a second substrate via a dielectric layer. One or more power devices assemblies are bonded to the second substrate. The first surface of the substrate is etched to provide a structured surface such as a plurality of receiving contours. A manifold formed as a multilayer cooling structure that includes at least an upper cavity and a lower cavity in a system vertical direction is bonded to the first substrate. The cooling manifold is positioned in close contact with the one or more power devices assemblies. Further, the manifold includes an inlet and opposite outlet, which are in fluid communication with the upper and lower cavities and which supply and collect coolant to the plurality of jet impingement fin assemblies on the substrate.

As such, the coolant flows into the upper cavity of the manifold through the inlet pipe and is then distributed to impinge into each of the plurality of jet impingement fin assemblies on the first substrate, carrying away the heat generated by the one or more electronic power devices coupled to the first substrate. The now heated coolant is then collected by the lower cavity of the manifold and flows into the outlet pipe. These and additional embodiments will be described in greater detail herein.

In the embodiments described herein, the need for thermal resistance layers between the one or more power devices assemblies and the first cooling surface is eliminated thereby cooling the one or more power devices assemblies to a lower temperature and/or enable higher operation of the one or more power devices assemblies.

Conventional motor drive systems in electrified vehicles (e.g., hybrid electrical vehicles, plug-in hybrid electric vehicles, fuel cell vehicle, and electric vehicles) may include a motor and a power control unit (PCU) that supplies current to the motor from a current source (e.g., a battery). Accordingly, the PCU may include any number of components and/or modules that may allow the PCU to control current supplied to the motor (or other vehicle electronic). In particular, the PCU may include a driver board assembly. However, and as noted above, conventional PCUs may include power devices, which are packaged in power cartridges, which may be connected to a driver board. The power cartridges may be sandwiched in a liquid cooler to maintain a particular temperature while the power devices are switched on/off, which generates heat. These cartridges and cooling assemblies may have larger volume profiles and/or result in reduced power density.

Embodiments of the present disclosure are directed to assemblies providing lower volume profiles and/or greater power density. Moreover, embodiments of the present disclosure allow for operation of high power devices (for example, greater than or equal to 40 kW, 50 kW, 60 kW, 70 kW, 80 kW, 90 kW, 100 kW, 110 kW, 120 kW, 130 kW, 140 kW, or 150 kW) that operate under high temperatures (for example, in excess of 100° C., 150° C., 175° C., 200° C., 225° C., or 250° C.), which generate a large amount of heat that must be removed for the continued operation of the PCU. In particular, the various cooling structures with embedded cooling fluid channels, as will be described in greater detail below, allow for efficient cooling of the one or more power devices to prevent overheating, damage, or the like.

As used herein, the term "assembly longitudinal direction" refers to the forward-rearward direction of the assembly (i.e., in the +/−assembly X-direction as depicted). The term "assembly lateral direction" refers to the cross-vehicle direction of the assembly (i.e., in the +/−assembly Y-direction as depicted), and is transverse to the assembly longitudinal direction. The term "assembly vertical direction" refers to the upward-downward direction of the assembly (i.e., in the +/−assembly Z-direction as depicted). As used herein, "upper" and "above" are defined as the positive Z direction of the coordinate axis shown in the drawings. "Lower" and "below" are defined as the negative Z direction of the coordinate axis shown in the drawings.

Figure 2:
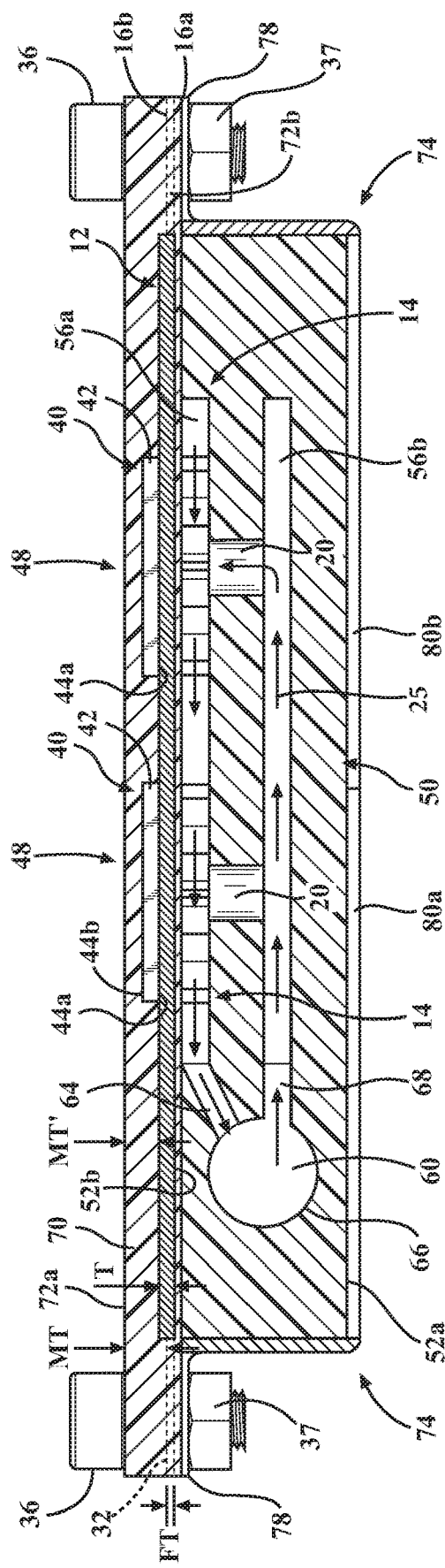
FIG. 2 schematically depicts a cross-sectional view of the driver board assembly of FIG. 1 taken from line 2-2 according to one or more embodiments shown and described herein.
Figure 3:
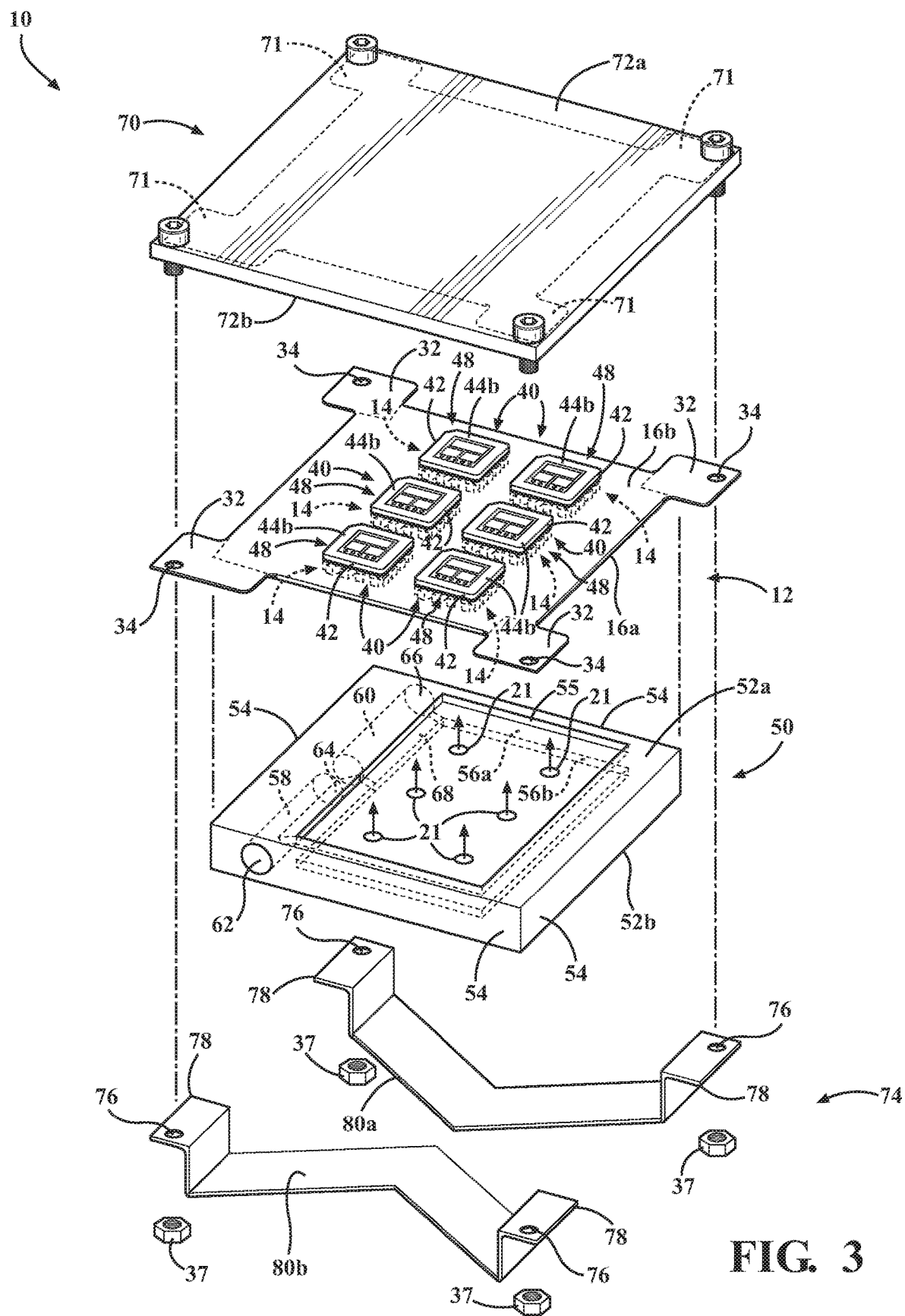
FIG. 3 schematically depicts a perspective partial exploded view of the driver board assembly of FIG. 1 according to one or more embodiments shown and described herein.
Figure 4A:
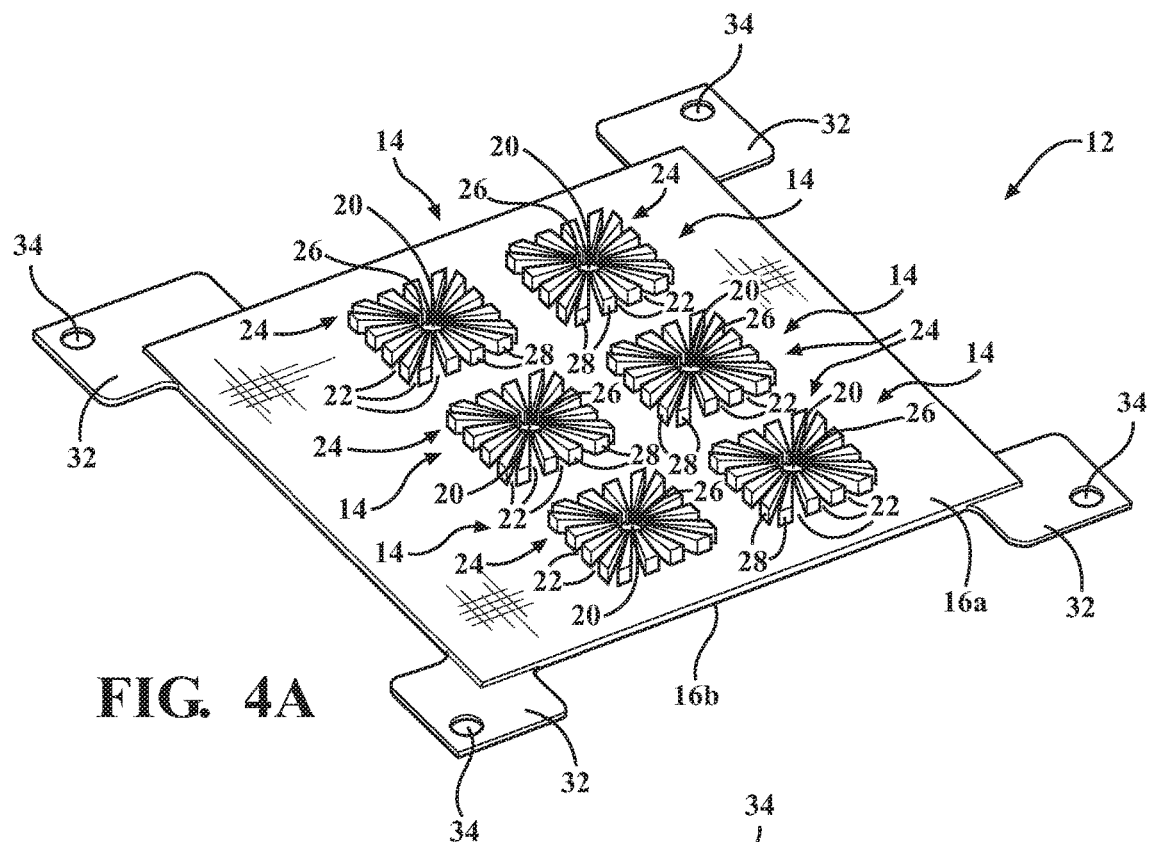
FIG. 4A schematically depicts a method of fabricating the driver board assembly of FIG. 1 by modifying a first substrate with a plurality of jet impingement fin assemblies and at least two flanges according to one or more embodiments shown and described herein.

Referring initially to FIGS. 1-4A, a driver board assembly 10 is schematically depicted. In particular, a first substrate 12 with a plurality of jet impingement fin assemblies 14 of the driver board assembly 10 will be described. The first substrate 12 includes a first surface 16a and an opposite second surface 16b to define a thickness T and may include at least two flanges 32. Each of the plurality of jet impingement fin assemblies 14 extend in a system vertical direction (i.e., in the +/−Z direction) from the first surface 16a of the first substrate 12. It is noted that in some embodiments, the plurality of jet impingement fin assemblies 14 may be uniformly spaced from one another, as best illustrated in FIG. 4A. In other embodiments, each of the plurality of jet impingement fin assemblies 14 are irregularly spaced from one another.

Each of the plurality of jet impingement fin assemblies 14 include an impingement receiving portion 20 that is at least partially circumferentially surrounded by a plurality of fluid microchannels 22. The plurality of fluid microchannels 22 may be defined by an array of fins 24 for example, pin fins, channel fins, or the like, that collectively define at least a portion the fluid flow path. The array of fins 24 increase the surface area of each of the jet impingement fin assemblies 14 such that a cooling fluid 25 (FIG. 4C) flowing therethrough may contact an increased surface area of the first substrate 12.

In some embodiments, the impingement receiving portion 20 is cylindrical in shape and is formed or defined by an inner terminating surface 26 of each of the array of fins 24. That is, each of the array of fins 24 extend radially from the inner terminating surface 26 to form or define the cylindrical shape of the impingement receiving portion 20. Further, each of the array of fins 24 extend radially from the inner terminating surface 26 and are spaced apart to form the plurality of fluid microchannels 22. In one embodiment, each of the plurality of fluid microchannels 22 are uniform and define a similar channel size (e.g. similar length, width and height). In other embodiments, each of the fluid microchannels 22 may be irregular defining varying channel sizes. In some embodiments, the array of fins 24 extend radially from the inner terminating surface 26 or from the cylindrical shape of the impingement receiving portion 20 to an outer terminating surface 28.

Still referring to FIGS. 1-4A, the outer terminating surface 28 may define or form a square outer perimeter, as best shown in FIG. 4A. In other embodiments, the array of fins 24 extend radially from the inner terminating surface 26 or from the impingement receiving portion 20 to form different irregular and regular outer perimeter shapes, such as a hexagonal, rectangular, circular, and the like. As such, each fin of the array of fins 24 extends from the first surface 16a of the first substrate 12 in the assembly vertical direction (i.e., in the +/−Z direction) a same distance. As such, the inner terminating surface 26 extends in the assembly vertical direction (i.e., in the +/−Z direction) such that the impingement receiving portion 20 extends in the assembly vertical direction (i.e., in the +/−Z direction). Further, each fin of the array of fins 24 may vary in shape and distance that each fin extends across the first surface 16a of the first substrate 12 in the assembly longitudinal direction (i.e., in the +/−X direction) and/or in the assembly lateral direction (i.e., in the +/−Y direction).

Each impingement receiving portion 20 is configured for the cooling fluid 25 (FIG. 4C) to flow through the impingement receiving portion 20 and impinge into the array of fins 24 on the first surface 16a so to carry away any heat transferred to the first substrate 12, as discussed in greater detail herein. It should be noted that the embodiments described herein and illustrated includes six jet impingement fin assemblies 14. This is non-limiting and there may be more or less jet impingement fin assemblies 14.

In some embodiments, the first substrate 12 is an aluminum material. In other embodiments, the first substrate 12 may be other materials such as copper, steel and the like. Further, in embodiments, at least two flanges 32 extend outwardly from opposite corners of the first substrate 12. It should be appreciated that in some embodiments, each corner of the first substrate 12 has a flange 32 extending therefrom. Each flange 32 may further include a bore 34 configured to accept a fastener 36 such as a bolt, a screw, and the like. In some embodiments, the fastener 36 is a bolt and a nut 37, as illustrated. Further, in some embodiments, each of the flanges 32 have a flange thickness FT that is less than the thickness T of the first substrate 12.

Still referring to FIGS. 1-4A, the first surface 16a of the first substrate 12 may be etched to form a plurality of receiving contours for securing the first substrate 12 to the example cooling manifold 50. That is, the first surface 16a of the first substrate 12 may be treated by an etching process that provides a structured surface with the plurality of receiving contours, such as undercuts and cavernous contours. In some embodiments the etching process may be a chemical etching process. In other embodiments, the etching process may be mechanical, electrical, and the like. Further, in some embodiments, a patterned mask or other device may assist in the etching process. That is, in some embodiments, the pattern mask may be positioned on the first surface 16a of the first substrate 12 where the mask may be configured to assist in forming the undercuts and the cavernous contours by assisting or preventing the chemical reaction in certain portions of the first surface 16a and/or by having a different etch rate than the first surface 16a of the first substrate 12 to assist in forming the undercuts and the cavernous contours.

Figure 4B:
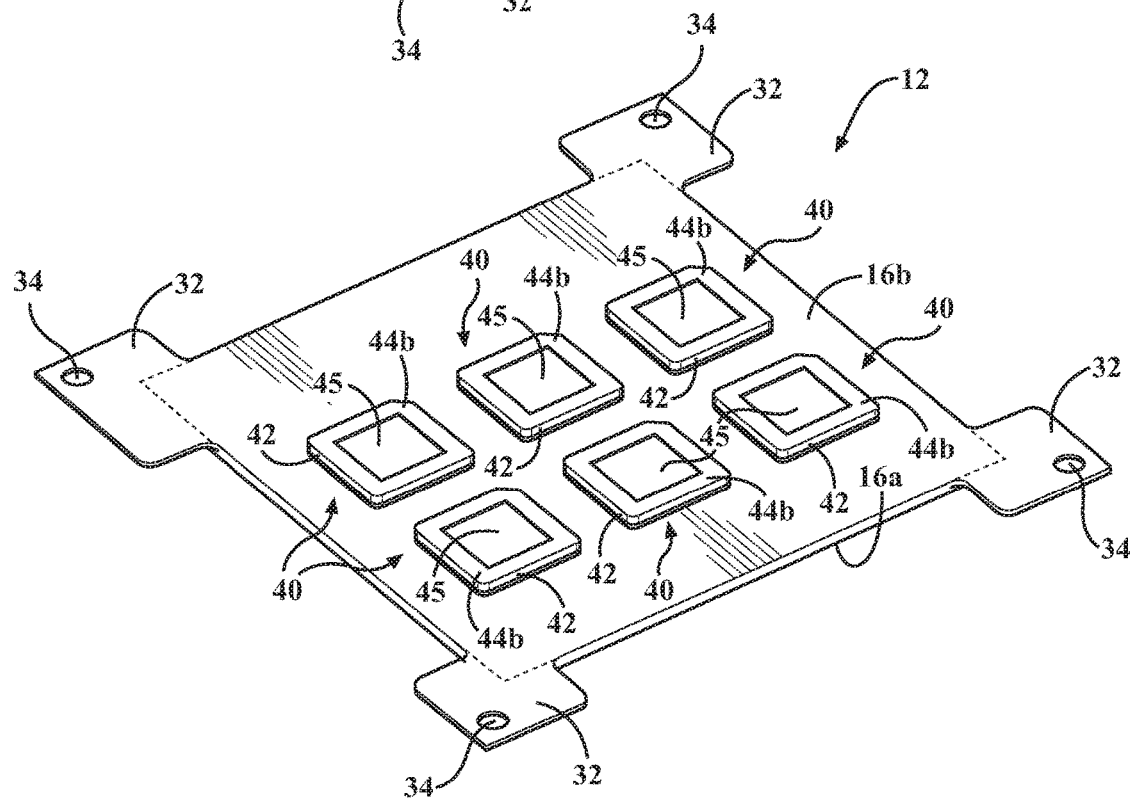
FIG. 4B schematically depicts a method of fabricating the driver board assembly of FIG. 1 by bonding a second substrate to the first substrate according to one or more embodiments shown and described herein.
Figure 4C:
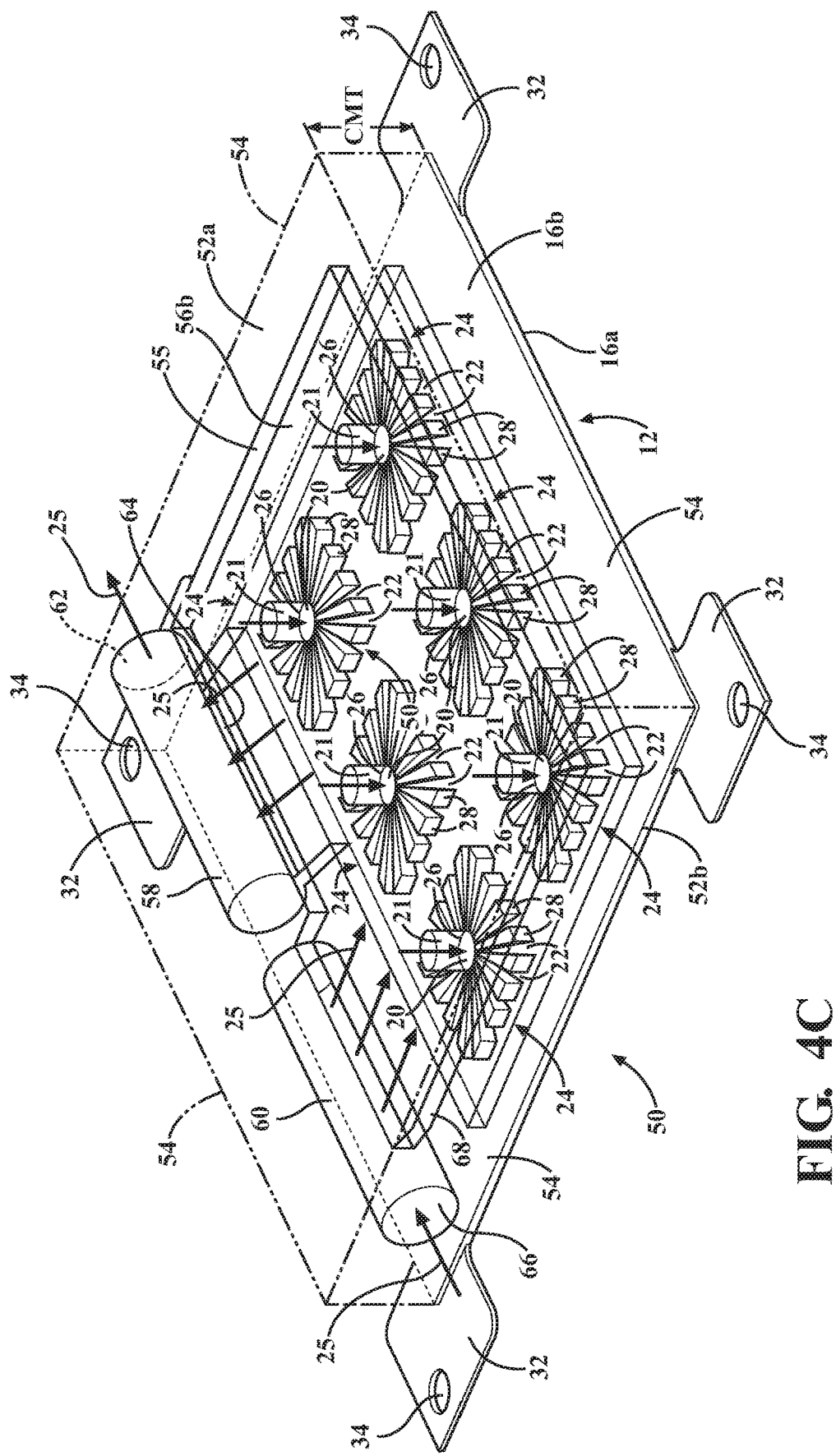
FIG. 4C schematically depicts a method of fabricating the driver board assembly of FIG. 1 by fabricating and bonding the cooling manifold to the first substrate according to one or more embodiments shown and described herein.

Referring now to FIGS. 1-3 and 4B, a plurality of second substrates 40 of the driver board assembly 10 is schematically depicted. It should be understood that while a plurality of second substrates 40 are schematically illustrated, only one second substrate 40 will be described herein. The second substrate 40 may be made from any electrically and/or thermally conductive material. For example, but not limited to, copper, aluminum, zinc, or the like. As best illustrated in FIG. 4B, the second substrate 40 may include a body 42 defining an inner surface 44a and an outer surface 44b opposite the inner surface 44a. Formed within the body 42 and extending inward from the outer surface 44b may be a recess 45. The recess 45 may be sized and shaped to receive one or more power device assemblies 48, as discussed in greater detail herein.

The inner surface 44a of the second substrate 40 is bonded to the second surface 16b of the first substrate 12 via a dielectric layer. In some embodiments, the second substrate 40 is a copper material. In other embodiments, the second substrate 40 is any conductive material, such as silver, carbon, nickel, gold and the like. In embodiments, the bonding may via an IMS material, which is a compound of aluminum, thermally conductive dielectric and copper. As such, it should be appreciated that thermally conductive particles within the dielectric transport heat to the aluminum layer of the first substrate 12 and the dielectric serves as medium for thermal conduction and for an insulation purposes when bonding the copper material of the second substrate 40 and the aluminum material of the first substrate 12.

Still referring to FIGS. 1-3 and 4B, in other embodiments, the thermally conductive dielectric is available with ceramic filler that may either be woven-glass reinforced or unreinforced. Further, in some embodiments, a ceramic layer may be used to direct bond the second substrate 40 to the first substrate 12, which is similar to direct bonded copper (DBC) or direct bonded aluminum (DBA) substrates, or active metal braze (AMB) substrate. The ceramic dielectric layer may be alumina ($Al_2O_3$), aluminum nitride (AlN), beryllium oxide (BeO), and the like.

In some embodiments, the second substrate 40 may include a plurality of second substrates, each individually bonded to the second surface 16b of the first substrate 12 via individual dielectric layers. Further, each of the plurality of second substrates 40 may be positioned to be coaxially aligned with the jet impingement fin assemblies 14 extending from the first surface 16a of the first substrate 12. That is, each of the plurality of second substrates 40 may extend in from the second surface 16b of the first substrate 12 in a direction opposite of each corresponding jet impingement fin assembly 14 extending from the first surface 16a of the first substrate 12. In some embodiments, each of the plurality of second substrates 40 is centered with the impingement receiving portion 20 of each corresponding jet impingement fin assembly 14.

Referring now to FIGS. 1-3, one or more power device assemblies 48 is schematically illustrated bonded onto the second substrate 40. It is noted that in some embodiments, the one or more power device assemblies 48 may include off-the-shelf power device assemblies, which are not in need of assembly. For example, the one or more power device assemblies 48 may include any electronic device, the operation of which may generate heat. For example, the one or more power device assemblies 48 may include a semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the one or more power device assemblies 48 may include a widebandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the one or more power device assemblies 48 may operate at high current and under high temperatures, for example in excess of 250° C. and generate a large amount of heat that must be removed for the continued operation of the example driver board assembly 10.

Still referring to FIGS. 1-3, the one or more power device assemblies 48 is positioned within the recess 45 formed within the second substrate 40. As such, the one or more power device assemblies 48 may be flush with the surface in which the recess 45 is formed, for example, the outer surface 44b in the illustrated embodiment. It should be understood that it is not necessary to bond the one or more power device assemblies 48 within the recess 45 of the second substrate 40 and that the outer surface 44b of second substrate 40 may be a planar surface. It should also be understood, that in come embodiments, each of the second substrates 40 may be any regular or irregular shape, may include the recess 45 or may not, may have a uniform thickness or may have an irregular thickness. Further, each of the second substrates 40 may be uniformly spaced apart or have irregular spacing, may receive similar components of the one or more power device assemblies 48, or receive different components, and the like.

In embodiments, the one or more power device assemblies 48 may be bonded to the outer surface 44b of the second substrate 40 and/or within the recess 45 using high temperature bonding technology. For example, the one or more power device assemblies 48 may be bonded to the outer surface 44b of the second substrate 40 using silver sintering, thermal bonding, transient liquid phase ("TLP") bonding, electrolytic or electroless bonding, and/or the like. In some embodiments, the bonding process is at a temperature greater than 250° C. In other embodiments, the bonding process is at a temperature greater than 320° C. As such, it should be understood that one or more additional layers, including but not limited to, an insulation layer and a thermally conductive layer is eliminated and are no longer necessary as a result of the arrangement of the first substrate 12, second substrate 40 and at the one or more power device assemblies 48, and the methods described herein.

Referring now to FIGS. 1-3 and 4C, an example cooling manifold 50 of the driver board assembly 10 is schematically depicted. The example cooling manifold 50 may be a partially enclosed structure that includes a first cooling surface 52a that includes a cavity portion 55 and a second cooling surface 52b spaced apart from the first cooling surface 52a to form a cooling manifold thickness CMT. The second cooling surface 52b may generally be a planar surface. The first cooling surface 52a may also generally be a planar surface with the cavity portion 55 that extends or opens inward towards the second cooling surface 52b. It should be understood that the size of the cavity portion 55 may depend on the position and the number of the jet impingement fin assemblies 14 on the first substrate 12, as discussed in greater detail herein.

The example cooling manifold 50 includes at least one peripheral end 54. As illustrated, the example cooling manifold has four peripheral ends 54 to form a square shape. This is non-limiting and the example cooling manifold 50 may be cylindrical with one continuous one peripheral end 54, or may have more than four peripheral ends 54 to form, for example, a hexagonal shape, an octagonal shape, other regular and irregular shapes, a combination thereof, and the like.

The example cooling manifold 50 may be formed, in some embodiments, from a plastic material, such as Polyketone, Polypheactnylene Sulfide (PPS) Plastic, polyether ether ketone ("PEEK"), and/or the like. As such, the example cooling manifold 50 may be formed from any material that is thermally, or non-thermally conductive. Further, in some embodiments, the example cooling manifold 50 may be manufactured using three-dimensional printing techniques. In other embodiments, the example cooling manifold 50 may be manufactured using traditional techniques such as injection molding, casting, and/or the like. As such, as an example and not a limitation, the example cooling manifold 50 may be a unitary mold component. In other embodiments, the example cooling manifold 50 includes two or more components that are bonded together.

The example cooling manifold 50 may be a multilevel manifold. That is, the example cooling manifold 50 may be manufactured to include an inlet cavity 56b and an outlet cavity 56a in which the outlet cavity 56a is positioned above the inlet cavity 56b in the assembly vertical direction (i.e., in the +/−Z direction) to form the multilevel manifold. In some embodiments, the outlet and inlet cavities 56a, 56b have a similar thickness in the assembly vertical direction (i.e., in the +/−Z direction). In other embodiments, as illustrated, the outlet cavity 56a is thicker, or has a greater height than the inlet cavity 56b in the assembly vertical direction (i.e., in the +/−Z direction). In other embodiments, the inlet cavity 56b is thicker, or has a greater height than the outlet cavity 56a in the assembly vertical direction (i.e., in the +/−Z direction).

Still referring to FIGS. 1-3 and 4C, the example cooling manifold 50 includes a fluid outlet 58 and an opposite fluid inlet 60 positioned between the first and second cooling surfaces 52a, 52b. The fluid outlet 58 may be tubular with a fluid outlet opening 62 and at least one outlet fluid channel 64 and is configured to receive the cooling fluid 25 from outside the example cooling manifold 50. The at least one outlet fluid channel 64 may extend perpendicular to the fluid outlet 58. The fluid inlet 60 may be tubular with a fluid inlet opening 66 and at least one inlet fluid channel 68 and is configured to receive the cooling fluid 25 from within the example cooling manifold 50. The at least one inlet fluid channel 68 may extend perpendicular to the fluid inlet 60. The fluid outlet and inlet openings 62, 66 are positioned at opposite peripheral ends 54 of the example cooling manifold 50 and may extend in converging directions. That is, the fluid outlet 58 extends into the example cooling manifold 50 from one peripheral end 54 in the assembly lateral direction (i.e., the +/−Y direction) between the first cooling surface 52a and the second cooling surface 52b and the fluid inlet 60 extends into the example cooling manifold 50 from another peripheral end 54 in the assembly lateral direction (i.e., the +/−Y direction) between the first cooling surface 52a and the second cooling surface 52b.

That is, the fluid outlet 58 may extend from one peripheral end 54 in a direction towards the fluid inlet 60 and the fluid inlet 60 may extend from a different or another peripheral end 54 in a direction towards the fluid outlet 58. In some embodiments, the fluid outlet 58 and the fluid inlet 60 terminate spaced apart from one another. In other embodiments, a portion of the fluid outlet 58 and the fluid inlet 60 overlap within the example cooling manifold 50 in the assembly lateral direction (i.e., in the +/−Y direction) but remain spaced apart in the assembly vertical direction (i.e., in the +/−Z direction).

Further, the example cooling manifold 50 may include a plurality of impingement nozzles 21 that fluidly couples the inlet cavity 56b to the outlet cavity 56a in the system vertical direction (i.e., in the +/−Z direction). As such, each of the plurality of impingement nozzles 21 may be openings that align with the impingement receiving portion 20 of the jet impingement fin assemblies 14 such that cooling fluid 25 may move between the inlet cavity 56b to the outlet cavity 56a, as discussed in greater detail herein.

Still referring to FIGS. 1-3 and 4C, the fluid outlet 58 and the at least one outlet fluid channel 64 may be in fluid communication with the inlet cavity 56b of the example cooling manifold 50 and the fluid inlet 60 and the at least one inlet fluid channel 68 may be in communication with the outlet cavity 56a of example cooling manifold 50. As such, the inlet cavity 56b of the example cooling manifold 50, the fluid outlet 58, and the at least one outlet fluid channel 64 may also be in fluid communication with the each one of the plurality of impingement nozzles 21. Further, the outlet cavity 56a of the example cooling manifold 50, the fluid inlet 60, and the at least one inlet fluid channel 68 may also be in fluid communication with each of the plurality of fluid microchannels 22 formed from the array of fins 24. As such, the fluid outlet 58, the at least one outlet t fluid channel 64 and each one of the plurality of the impingement nozzles 21 direct the cooling fluid 25 to impinge into the plurality of fluid microchannels 22 formed onto the first surface 16a of the first substrate 12 to remove heat generated from each of the one or more power device assemblies 48, as discussed in greater detail herein. The fluid inlet 60, the at least one inlet fluid channel 68 and the plurality of fluid microchannels 22 direct the cooling fluid 25 away from the first substrate 12 and out of the example cooling manifold 50, as discussed in greater detail herein.

As such, the fluid outlet 58 may extend into the example cooling manifold 50 to fluidly couple the fluid outlet opening 62 and the at least one outlet fluid channel 64 to the inlet cavity 56b of the example cooling manifold 50 and to each one of the plurality of impingement nozzles 21 of the plurality of jet impingement fin assemblies 14. In some embodiments, the at least one outlet fluid channel 64 may extend from the fluid outlet 58 in a direction perpendicular to the fluid outlet opening 62 and/or the fluid outlet 58. Further, in some embodiments, the at least one outlet fluid channel 64 may be angled with respect to the fluid outlet 58 to direct, move or transition the cooling fluid 25 in the assembly vertical direction (i.e., in the +/−Z direction) to flow through the inlet cavity 56b of the example cooling manifold 50. In other embodiments, the at least one outlet fluid channel 64 may be a plurality of apertures positioned along a surface of the fluid outlet 58 to direct, move or transition the cooling fluid 25 in the assembly vertical direction (i.e., in the +/−Z direction) to flow into and through the inlet cavity 56b of the example cooling manifold 50.

Still referring to FIGS. 1-3 and 4C, the fluid inlet 60 may extend into the example cooling manifold 50 to fluidly couple the fluid inlet opening 66 to the outlet cavity 56a of the example cooling manifold 50 and to each of the plurality of fluid microchannels 22 of the plurality of jet impingement fin assemblies 14. In some embodiments, the at least one inlet fluid channel 68 may extend from the fluid inlet 60 in a direction perpendicular to the fluid inlet opening 66 and/or the fluid inlet 60. Further, in some embodiments, the at least one inlet fluid channel 68 may be angled and extend from the outlet cavity 56a of the example cooling manifold 50 to direct, move or transition the cooling fluid 25 to flow from the outlet cavity 56a of the example cooling manifold 50 into the fluid inlet 60. In other embodiments, the at least one inlet fluid channel 68 may be a plurality of apertures positioned along a surface of the fluid inlet 60 to receive the cooling fluid 25 and direct the cooling fluid 25 through the fluid inlet 60.

As such, it should be appreciated the fluid outlet opening 62 receives the cooling fluid 25, which then travels through the fluid outlet 58, into the at least one outlet fluid channel 64 and is dispersed into each one of the plurality of impingement nozzles 21 of the plurality of jet impingement fin assemblies 14 to flow through each one of the plurality of the impingement nozzles 21 and impinges into the plurality of fluid microchannels 22 on the first surface 16a of the first substrate 12. The cooling fluid 25 carries away any heat transferred to the first substrate 12, generated from the one or more power device assemblies 48, as discussed in greater detail herein. The now heated cooling fluid is collected by the at least one inlet fluid channel 68, which directs the heated cooling fluid into the fluid inlet 60 and exits the fluid inlet opening 66 to exit the example cooling manifold 50. It should be understood that as the cooling fluid 25 flows though each one of the plurality of the impingement nozzles 21 to the plurality of fluid microchannels 22, the cooling fluid 25 is flowing in the assembly vertical direction (i.e., in the +/−Z direction) from the inlet cavity 56b to the outlet cavity 56a. That is, for the cooling fluid 25 to flow from the inlet cavity 56b to the outlet cavity 56a, the cooling fluid 25 flows in the assembly vertical direction (i.e., in the +/−Z direction) within each one of the plurality of the impingement nozzles 21.

Portions of the first cooling surface 52a of the example cooling manifold 50 are bonded to portions of the first surface 16a of the first substrate 12 such that each of the plurality of jet impingement fin assemblies 14 is positioned within the cavity portion 55 of the first cooling surface 52a. In some embodiments, the example cooling manifold 50 may be bonded to the first substrate 12 via bonding methods such welding techniques. In other embodiments, the example cooling manifold 50 may be bonded to the first substrate 12 by heating up the first substrate 12 and pressing the first cooling surface 52a of the example cooling manifold 50 into the first surface 16a of the first substrate 12 to form a plastic joint. In a non-limiting example, the first substrate 12 maybe heated between 250° C. to 320° C., depending on the material of the first cooling surface 52a.

Still referring to FIGS. 1-3 and 4C it should be appreciated that the liquidpolymer of the first cooling surface 52a is pressed into the plurality of receiving contours (e.g., the undercuts and cavernous contours of the first surface 16a of the first substrate 12 created from the etching), such that the liquid polymer material fills the undercuts and cavernous contours of the first surface 16a of the first substrate 12. As such, the liquid polymer material fills the undercuts and cavernous contours of the first surface 16a of the first substrate 12 without air pockets or voids. Once the first substrate 12 and the first cooling surface 52a of the example cooling manifold 50 cool, an aluminum to plastic joint will be formed. Further, the structures in the sub-micrometer range are completely wetted with plastic.

It should be appreciated that this bond yields a high-strength mechanical connection and an extremely tight connection, which has advantages of not requiring a sealing element, soldering, or screwing. Further the bond is resistant to corrosion and does not require assembly while reducing and/or eliminating any risk of leaks. Further, the bond permits a plurality shapes of example cooling manifold 50 and is cost effective. In some embodiments, for example, the bonding has passed pressure pulsating test of 3.5 bar absolute pressure at 1 Hz sinusoidal frequency and steady pressure test at more than 5 bar. Further, in some embodiments, for example, the bonding also passed 2000 cycle thermal shock test from −30° C. to 80° C.

Still referring to FIGS. 1-3 and 4C, the fluid outlet opening 62 may be connected to a pump (not shown) such that the cooling fluid 25 may be pumped through the fluid outlet 58 and out of the fluid inlet 60 as described above. In operation, the cooling fluid flowing through the example cooling manifold 50 may remove heat from one or more heat generating devices thermally coupled to the first substrate 12, for example, the one or more power device assemblies 48. A cooling fluid reservoir (not shown) may be fluidly connected to the fluid pump (not shown), the fluid outlet 58 and/or the fluid inlet 60 such that the cooling fluid reservoir (not shown) may house the cooling fluid, and the fluid pump (not shown) may pump the cooling fluid through the example cooling manifold 50. For example, the cooling fluid may be pumped from the cooling fluid reservoir (not shown) into the fluid outlet 58, through the example cooling manifold 50 and out of the fluid inlet 60 back into the cooling fluid reservoir (not shown). Further, a secondary heat exchanger (not shown) may remove heat collected by the cooling fluid before the cooling fluid enters the cooling fluid reservoir (not shown).

As a result of the example cooling manifold 50, it should be appreciated that the cooling fluid is warmer across the first substrate 12 passing through the plurality of fluid microchannels 22 than from at the fluid outlet 58. It should also be appreciated that the versatility of the example cooling manifold 50 permits the cooling fluid to cool some components prior to others so that the cooling fluid increases in temperature from the fluid outlet 58 to the fluid inlet 60. For instance, some of the one or more power device assemblies 48 may need a lower temperature cooling fluid than others.

In some embodiments, the cooling fluid 25 may be a dielectric cooling fluid. Non-limiting dielectric cooling fluids include R-245fa and HFE-7100. Other dielectric cooling fluids may be utilized. The type of dielectric cooling fluid chosen may depend on the operating temperature of the heat generating devices to be cooled. In other embodiments, the cooling fluid 25 may be non-dielectric, such as automotive coolant, water-ethylene glycol, and the like.

Figure 4D:
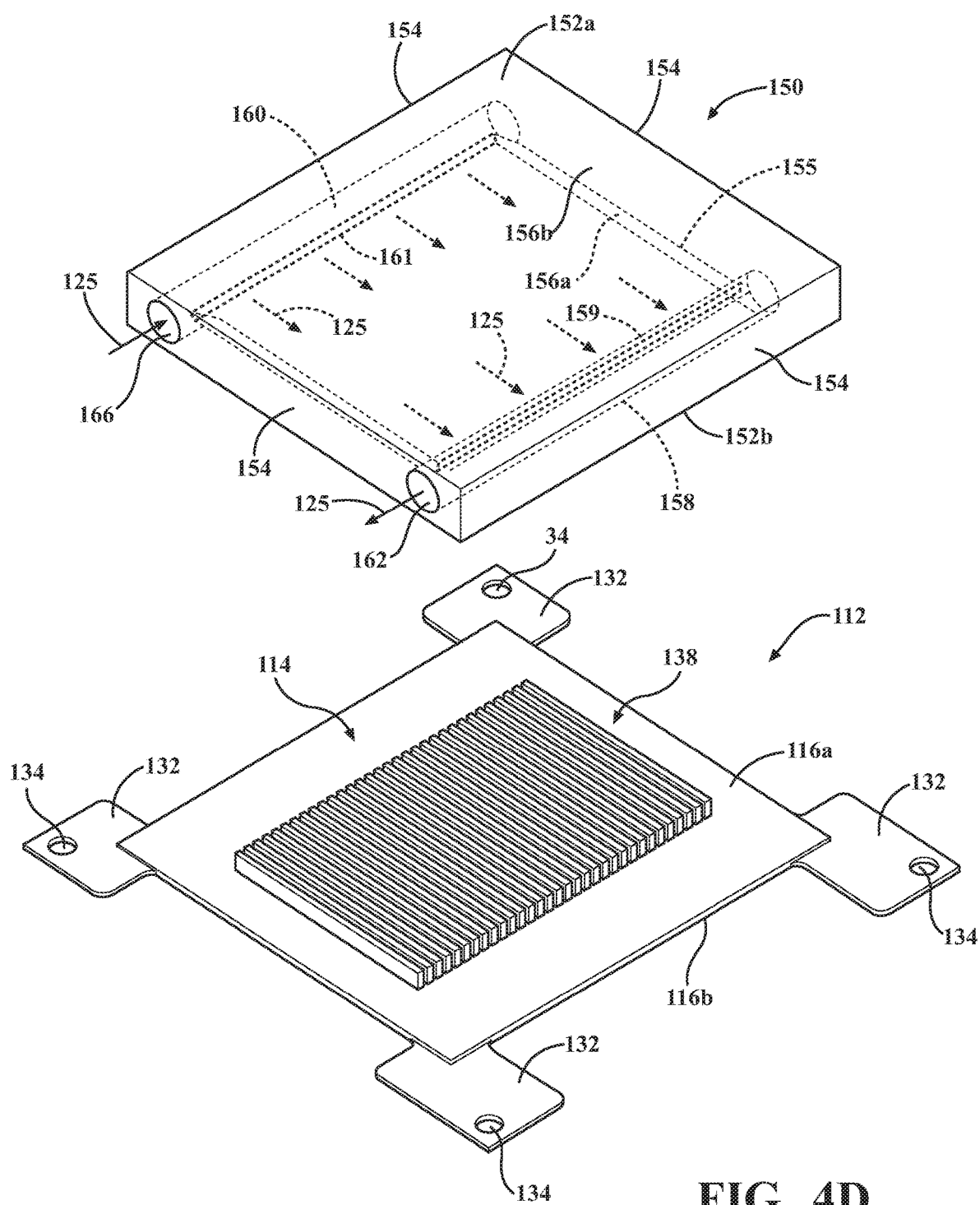
FIG. 4D schematically depicts an alternative method of fabricating the driver board assembly of FIG. 1 by fabricating and bonding a second aspect cooling manifold to the first substrate according to one or more embodiments shown and described herein.

Now referring to FIG. 4D a second aspect of the second example cooling manifold 150 and a first substrate 112 is schematically depicted. It is understood that the second example cooling manifold 150 is similar to the example cooling manifold 50 with the exceptions of the features described herein. Further, is understood that the first substrate 112 is similar to the first substrate 12 with the exceptions of the features described herein. As such, like features will use the same reference numerals with a prefix "1" for the reference numbers. As such, for brevity reasons, these features will not be described again.

In this alternative aspect, the plurality of jet impingement fin assemblies 114 may include the array of fins 138 that extend in a singular or linear fin arrangement (e.g. each fin extends in the assembly lateral direction or in the assembly longitudinal direction) and each fin of the array of fins 138 extends from the first surface 116a of the first substrate 112 in the assembly vertical direction (i.e., in the +/−Z direction) a same distance. As such, in this embodiment, the cooling fluid 125 flows through the linear fin arrangement of the array of fins 138 on the first surface 116a so to carry away any heat transferred to the first substrate 112, as discussed in greater detail herein.

The second example cooling manifold 150 may be a partially enclosed structure that includes a first cooling surface 152a that includes a cavity portion 155 and a second cooling surface 152b spaced apart from the first cooling surface 152a. The second example cooling manifold 150 may be a single level manifold 152. That is, the example cooling manifold 150 may be manufactured to include only a single linear level. Further, the second example cooling manifold 150 includes a fluid outlet 158 and an opposite fluid inlet 160 positioned between the first and second cooling surfaces 152a, 152b. The fluid outlet 158 may be a partially tubular structure with a fluid outlet opening 162 and a fluid transfer cutout 159 and is configured to receive the cooling fluid 125 from outside the second example cooling manifold 150. The fluid inlet 160 may be partially tubular with a fluid inlet opening 166 and a fluid receiving cutout 161 and is configured to receive the cooling fluid 125 from within the second example cooling manifold 150.

Still referring to FIG. 4D, the fluid outlet and inlet openings 162, 166 are spaced apart and may be positioned at the same peripheral end 154 of the second example cooling manifold 150. As such, the fluid outlet 158 may extend into the example cooling manifold 150 from one portion of peripheral end 154 in the assembly lateral direction (i.e., the +/−Y direction) between the first cooling surface 152a and the second cooling surface 152b and the fluid inlet 160 may extend into the second example cooling manifold 150 from another portion of the peripheral end 54 in the assembly lateral direction (i.e., the +/−Y direction) between the first cooling surface 152a and the second cooling surface 152b. This is non-limiting and the fluid outlet 158 and the fluid inlet 160 may extend from different portions of peripheral end 154 in the assembly longitudinal direction (i.e., the +/−X direction) between the first cooling surface 152a and the second cooling surface 152b.

The fluid transfer cutout 159 and the fluid receiving cutout 161 are each in fluid communication with the array of fins 138 and the plurality of fluid microchannels 122 formed therebetween. As such, the fluid outlet 158 and the fluid transfer cutout 159 direct the cooling fluid 125 to flow into the plurality of fluid microchannels 122 formed onto the first surface 116a of the first substrate 112 to remove heat generated from each of the one or more power device assemblies 148, as discussed in greater detail herein. The fluid inlet 160 and the fluid receiving cutout 161 receive the cooling fluid from the plurality of fluid microchannels 22 direct the cooling fluid 125 away from the first substrate 112 and out of the example cooling manifold 150, as discussed in greater detail herein.

Now referring back to FIGS. 1-3, the first substrate 12, the second substrate 40 and one or more power device assemblies 48 may be embedded within a printed circuit board ("PCB") material layer 70. Generally, PCB substrates are formed from one or more layers of conductive material (e.g., copper, aluminum, silver, nickel, and the like) are etched to form various conductive pathways laminated onto and/or between sheets/layers of non-conductive substrates (e.g., dielectric polymer layers) to form a PCB material layer 70. The PCB material layer 70 may include a first PCB surface 72a and a second PCB surface 72b opposite the first PCB surface 72a. It should be appreciated that the PCB material layer 70 may be integrally formed and may have a thickness greater at assembly portions 71 than other portions of the PCB material layer 70. That is, each of the assembly portions 71 may have a thickness MT which is greater than a thickness MT' formed by the first PCB surface 72a and a second PCB surface 72b at the areas that cover or encapsulate the one or more power device assemblies 48.

The PCB material layers 70 may include any known or yet to be discovered materials, for example, without limitation, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), PTFE (Polytetrafluoroethylene), RF-35 (fiberglass-reinforced ceramics-filled PTFE), alumina, polyimide. The PCB material layers 70 may be a laminate, cloth or fiber material, resin, silicon, polymer, or the like. It should be appreciated that the PCB material layer 70 may be chosen based on the temperature range (e.g., the operating temperature) of the embedded power semiconductor device.

The one or more layers may be fused via heat and/or pressure to form the PCB material layer 70. The one or more layers may be fused together around the one or more power device assemblies 48. For example, the recess 45 configured to receive the one or more power device assemblies 48 may be carved within the one or more layers. Additional layering may be added to cover the one or more power device assemblies 48 positioned within the recess 45 to enclose or embed the one or more power device assemblies 48 within the PCB material layers 70. As such, the PCB material layers 70 are configured to be directly deposited onto the one or more power device assemblies 48, the second substrate 40 and portions of the first substrate 12. That is, the PCB material layers 70 may encapsulate the second surface 16b and the at least two flanges 32 and at least a portion of the first surface 16a of the first substrate 12. Thereafter the PCB material layers 70 may be laminated together (e.g., via heat and/or pressure).

Referring now to FIGS. 1-2, the one or more power device assemblies 48 are illustrated as embedded within the PCB material layer 70. Thought not shown, conductive material configured to connect the one or more power device assemblies 48 to one or more power sources and/or power receptors (e.g., an electric motor), may also be embedded within the PCB material layer 70. In some embodiments, the one or more power device assemblies 48 may include multiple power device assemblies 48 (for example, two or more, 4 or more, 6 or more, of the like). In some embodiments, the one or more power device assemblies 48 may be arranged with the conductive material to provide an inverter, converter, or other electrical topology.

As noted above, the one or more power device assemblies 48 may be embedded within the PCB material layer 70 so to be arranged between the first PCB surface 72a and the second PCB surface 72b and spaced therefrom. Further, the at least two flanges 32 are fully embedded in the PCB material layer 70 and positioned between the first PCB surface 72a and the second PCB surface 72b at the assembly portions 71. That is, it should be appreciated that the thinner thickness of the at least two flanges compared to the thickness of the first substrate permit the PCB material layer 70 to fully encapsulate the at least two flanges 32. It should be appreciated that the first PCB surface 72a and the second PCB surface 72b are both generally planar surfaces.

Now referring back to FIGS. 1-3, the PCB material layer 70 may be supported with a rigid member 74. The rigid member 74 may include a bore 76 positioned at each edge 78 that corresponds to the bore 34 of each of the at least two flanges 32. As such, the bores 76 of the rigid member 74 align with the bores 34 of the at least two flanges 32 such that in an attached positon, the respectively aligned bore 76 of the rigid member 74 and the bore 34 of the at least two flanges 32 receive the fastener 36 to couple the rigid member 74 to the PCB material layer 70 via the at least two flanges 32.

As such, the rigid member 74 provides increased mechanical rigidity of the driver board assembly 10 and, in some embodiments, may further provide mechanical strength to retain the bond of the example cooling manifold 50 to the first substrate 12. In some embodiments, the rigid member 74 is a unitary member. In other embodiments, the rigid member 74 may be two or more members 80a, 80b. As such, in this embodiment, the two or more members 80a, 80b of the rigid member 74 may be a generally "X" shape and may only partially make contact with the example cooling manifold 50 in the attached position, as best shown in FIG. 3.

Figure 5:
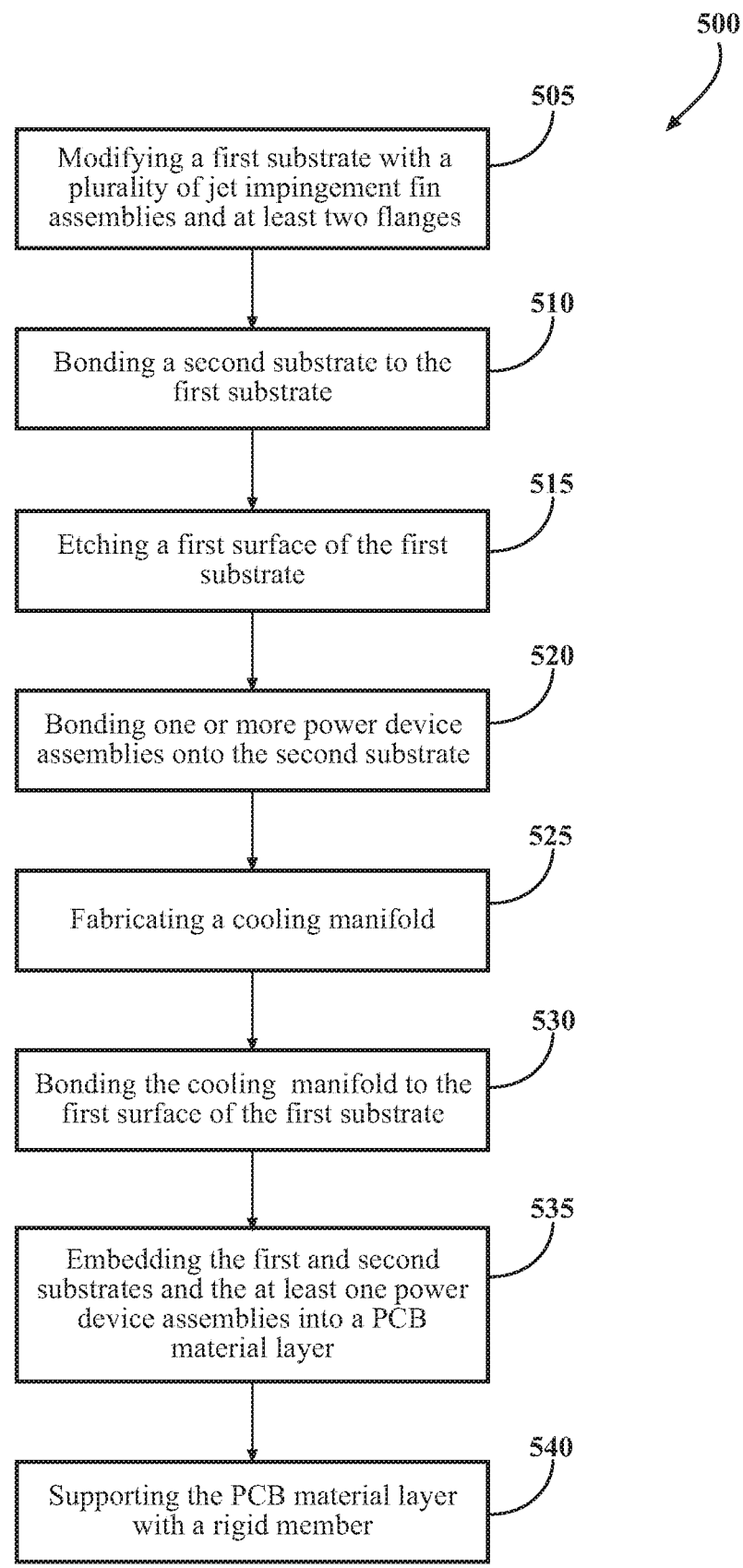
FIG. 5 is a flowchart of the method of FIGS. 4A-4D for fabricating the driver board assembly.

Referring now to FIG. 5, a flow chart depicting a method 500 of assembling a driver board assembly is generally depicted. It is noted that the method may include a greater or fewer number of steps than depicted in any order, without departing from the scope of the present disclosure.

For example, the method 500 for assembling a driver board assembly may include, at block 505, forming a first substrate with a plurality of jet impingement fin assemblies and at least two flanges. The method continues with bonding a second substrate to the first substrate, at block 510. The first surface of the first substrate is etched to form the plurality of receiving contours, at block 515. Then, one or more power device assemblies is bonded onto the second substrate 40, at block 515. In some embodiments, the one or more power device assemblies is bonded within the recess of the second substrate. In other embodiments, the one or more power device assemblies is bonded to the outer surface of the second substrate.

Still referring to FIG. 5, the method 500 may further include, at block 525, forming the example cooling manifold. In some embodiments, the example cooling manifold may be formed using three-dimensional printing techniques. In other embodiments, the example cooling manifold is formed using injection molding, casting, and the like. At block 530, the example cooling manifold is bonded to the first substrate. In some embossments, example cooling manifold is bonded to the first substrate via plastic welding. Further, it should be understood that while only the example cooling manifold is referred to in the method 500, the blocks 530 through blocks 540 also apply to the second example cooling manifold.

Still referring to FIG. 5, the method 500 may include, at block 535, embedding the first and second substrates and the one or more power device assemblies within the PCB material layer. In some embodiments, the second substrate and the one or more power device assemblies are fully encased within the PCB material layer and a portion of the first substrate is embedded within the PCB material layer. In particular, in these embodiments, the second surface and the at least two flanges of the first substrate and encased within the PCB material layer. At block 540, a rigid member is installed to support the PCB material layer.

It should now be understood that embodiments of the present disclosure are directed to driver board assemblies and methods of assembling a driver board. In the embodiments described herein, driver board assemblies include a custom first substrate having jet impingement assemblies and a cooling manifold that is multilayered such that a cooling fluid may vertical impinge the first substrate via the jet impingement assemblies. Further, a second substrate having one or more power device assemblies positioned thereon and at least a portion of the first substrate are embedded within a printed circuit board material layer. As such, the cooling manifold is bonded to the first substrate such that the cooling manifold in close contact with the one or more power devices assemblies as well as jet impingement assemblies to cool the power device assemblies. As such, the need for thermal resistance layers between the one or more power devices assemblies and the first cooling surface is eliminated thereby cooling the one or more power devices assemblies to a lower temperature and/or enable higher operation of the one or more power devices assemblies.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A driver board assembly, comprising:
   a first substrate having a first surface and an opposite second surface, at least one jet impingement assembly formed on the first surface of the first substrate, wherein the at least one jet impingement assembly extends in a system vertical direction from the first surface, the at least one jet impingement assembly includes an impingement receiving portion that is at least partially circumferentially surrounded by a plurality of fluid microchannels that extend radially from the impingement receiving portion along the first surface;
   a second substrate having a first substrate surface and a second substrate surface opposite the first substrate surface, wherein the first substrate surface is bonded onto a second surface of the first substrate, and the second substrate surface has a recess;
   a plurality of receiving contours etched within the first surface of the first substrate;
   one or more power device assemblies bonded into the recess of the second substrate surface of the second substrate; and
   a cooling manifold having a first cooling surface and an opposite second cooling surface and a cavity that extends within the first cooling surface, wherein the first cooling surface is bonded to the first surface such that the first cooling surface bonds within the plurality of receiving contours within the first surface of the first substrate, and the cavity of the first cooling surface receives at least a portion of the first substrate and the at least one jet impingement assembly.

2. The driver board assembly of claim 1, wherein:
   the plurality of fluid microchannels are defined by an array of fins that collectively define at least a portion a fluid flow path; and
   the array of fins increase a surface area of the at least one jet impingement assembly.

3. The driver board assembly of claim 1, wherein the cooling manifold further comprises:
   a fluid inlet opening fluidly coupled to a fluid inlet and at least one inlet fluid channel to fluidly couple the at least one inlet fluid channel to a fluid source; and
   a fluid outlet opening fluidly coupled to a fluid outlet and at least one outlet fluid channel to fluidly couple the at least one outlet fluid channel for removal of a cooling fluid from the at least one inlet fluid channel.

4. The driver board assembly of claim 3, wherein the at least one inlet fluid channel is oriented perpendicular to the fluid inlet and the at least one outlet fluid channel is oriented perpendicular to the fluid outlet.

5. The driver board assembly of claim 4, wherein the cooling manifold further comprises:
   an inlet cavity; and
   an outlet cavity positioned above the inlet cavity in an assembly vertical direction,
   wherein the at least one inlet fluid channel is fluidly coupled to the inlet cavity and the at least one outlet fluid channel is fluidly coupled to the outlet cavity.

6. The driver board assembly of claim 5, wherein the impingement receiving portion is fluidly coupled to the at least one inlet fluid channel and the plurality of fluid microchannels are fluidly coupled to the at least one outlet fluid channel to form a portion of a fluid flow path such that the cooling fluid vertically passes through the inlet cavity into the outlet cavity in the system vertical direction to impinge the first surface of the first substrate.

7. The driver board assembly of claim 1, wherein the second substrate is bonded onto the second surface of the first substrate such that the second substrate is coaxially aligned with the at least one jet impingement assembly.

8. The driver board assembly of claim 1, wherein the one or more power device assemblies is bonded into the recess of the second substrate such that the impingement receiving portion and the plurality of fluid microchannels extend proximate to the one or more power device assemblies.

9. The driver board assembly of claim 1, further comprising:
   a printed circuit board material layer that embeds at least a portion of the first substrate, the second substrate and the one or more power device assemblies.

10. The driver board assembly of claim 9, further comprising:
    at least a pair of flanges extend outwardly from the first substrate; and
    a rigid member that releasably couples to each of the at least a pair of flanges, wherein the rigid member supports the printed circuit board material layer via the at least a pair of flanges of the first substrate.

11. A method of manufacturing a driver board assembly comprising:

forming a first substrate with at least one jet impingement assembly on a first surface of the first substrate, wherein the at least one jet impingement assembly extends in a system vertical direction from the first surface, wherein the at least one jet impingement assembly includes an impingement receiving portion that is at least partially circumferentially surrounded by a plurality of fluid microchannels that extend radially from the impingement receiving portion along the first surface;

bonding a second substrate onto a second surface of the first substrate, wherein the second surface is opposite the first surface of the first substrate;

etching the first surface of the first substrate to form a plurality of receiving contours within the first surface of the first substrate;

bonding one or more power device assemblies onto the second substrate;

forming a cooling manifold having a first cooling surface and an opposite second cooling surface, a cavity extends within the first cooling surface; and bonding the first cooling surface of the cooling manifold to the first surface such that the first cooling surface bonds within the plurality of receiving contours within the first surface of the first substrate, wherein the cavity of the first cooling surface receives at least a portion of the first substrate and the at least one jet impingement assembly.

12. The method of claim 11, wherein the plurality of fluid microchannels are defined by an array of fins that collectively define at least a portion a fluid flow path.

13. The method of claim 12, wherein the array of fins increase a surface area of the at least one jet impingement assembly.

14. The method of claim 11, wherein the cooling manifold further comprises:

a fluid inlet opening fluidly coupled to a fluid inlet and at least one inlet fluid channel to fluidly couple the at least one inlet fluid channel to a fluid source; and a fluid outlet opening fluidly coupled to a fluid outlet and at least one outlet fluid channel to fluidly couple the at least one outlet fluid channel for removal of a cooling fluid from the at least one inlet fluid channel.

15. The method of claim 14, wherein the at least one inlet fluid channel is oriented perpendicular to the fluid inlet and the at least one outlet fluid channel is oriented perpendicular to the fluid outlet.

16. The method of claim 14, wherein the cooling manifold further comprises:

a inlet cavity; and an outlet cavity positioned above the inlet cavity in an assembly vertical direction, wherein the at least one inlet fluid channel is fluidly coupled to the inlet cavity and the at least one outlet fluid channel is fluidly coupled to the outlet cavity.

17. The method of claim 16, wherein the impingement receiving portion is fluidly coupled to the at least one inlet fluid channel and the plurality of fluid microchannels are fluidly coupled to the at least one outlet fluid channel to form a portion of a fluid flow path such that the cooling fluid vertically passes through the inlet cavity into the outlet cavity in the system vertical direction to impinge the first surface of the first substrate.

18. The method of claim 11, wherein the second substrate is bonded onto the second surface of the first substrate such that the second substrate is coaxially aligned with the at least one jet impingement assembly.

19. The method of claim 11, wherein the bonding the one or more power device assemblies onto the second substrate is such that the impingement receiving portion and the plurality of fluid microchannels extend proximate to one or more power device assemblies.

20. The method of claim 11, further comprising:

embedding at least a portion of the first substrate, the second substrate and the one or more power device assemblies into a printed circuit board material layer; and supporting the printed circuit board material layer with a rigid member.

* * * * *